(12) United States Patent
Lee

(10) Patent No.: US 7,692,302 B2
(45) Date of Patent: Apr. 6, 2010

(54) SIP SEMICONDUCTOR DEVICE AND METHOD FOR MANUFACTURING THE SAME

(75) Inventor: Han-Choon Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/424,003

(22) Filed: Apr. 15, 2009

(65) Prior Publication Data

US 2009/0200671 A1 Aug. 13, 2009

Related U.S. Application Data

(63) Continuation of application No. 11/781,547, filed on Jul. 23, 2007, now Pat. No. 7,531,451.

(30) Foreign Application Priority Data

Jul. 24, 2006 (KR) ...................... 10-2006-0068991

(51) Int. Cl.
*H01L 21/44* (2006.01)
(52) U.S. Cl. ................ 257/751; 257/767; 257/E23.161
(58) Field of Classification Search ................. 257/751, 257/686, E23.161, 763, 764, 767
See application file for complete search history.

(56) References Cited

U.S. PATENT DOCUMENTS 5,933,758 A 8/1999 Jain
6,927,160 B1 8/2005 Kitch

*Primary Examiner*—Roy K Potter
(74) *Attorney, Agent, or Firm*—Sherr & Vaughn, PLLC

(57) ABSTRACT

A System In Package (SIP) semiconductor device and a method for manufacturing a SIP device. A TiSiN film may be used as a diffusion barrier film for metal wiring in a SIP semiconductor device. A TiSiN film may provide relatively good step coverage in a relatively easy formation process, which may maximize reliability of a semiconductor device.

10 Claims, 5 Drawing Sheets

SIP SEMICONDUCTOR DEVICE AND METHOD FOR MANUFACTURING THE SAME

This application is a Continuation Application of a U.S. patent application Ser. No. 11/781,547 filed on Jul. 23, 2007, now U.S. Pat. No. 7,531,451 which claims priority and the benefit under 35 U.S.C. 119 to Korean Patent Application No. 10-2006-0068991, filed on Jul. 24, 2006, which is hereby incorporated by reference in its entirety.

BACKGROUND

In some applications and aspects of semiconductor technology, minimizing the size and weight of semiconductor devices is desirable. For example, aspects of semiconductor technology relate to minimizing the size of embedded components. System On Chip (SOC) technology may integrate a plurality of components into one chip. System In Package (SIP) technology may integrate a plurality of devices or chips into one package.

SIP technology may incorporate (e.g. mount) a plurality of silicon chips vertically or horizontally in one package. SIP technology may be an extension of a Multi-Chip Module (MCM) concept. In some MCM configurations, integration of semiconductor devices may be implemented by horizontal mounting in a package. In some SIP configurations, chips may be stacked vertically.

Figure 3:
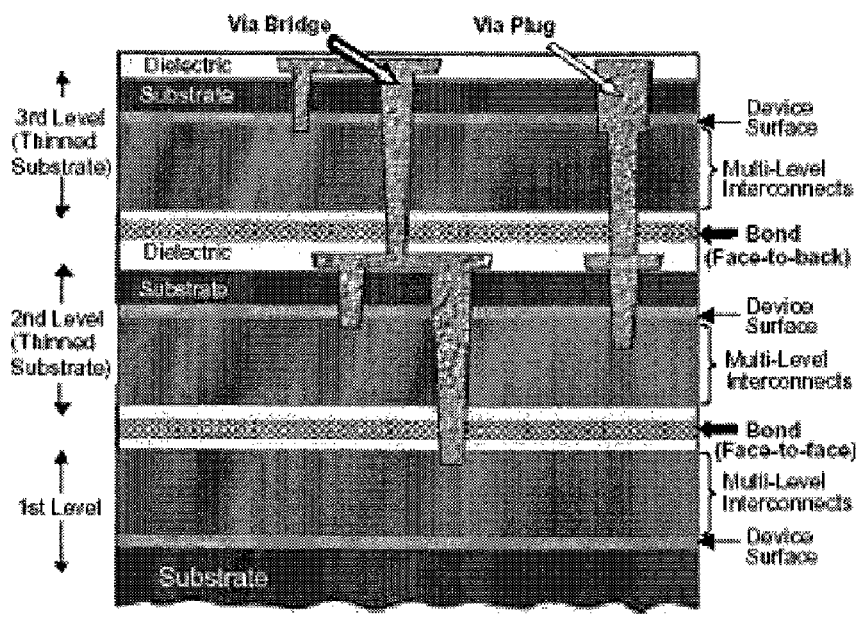

As illustrated in example FIG. 3, three manufactured devices may be vertically stacked, with wafers of the devices connected using a deep via. As illustrated in example FIG. 4, since devices are horizontally connected in a SOC, the size of a SOC semiconductor device may be larger than a SIP semiconductor device. In SIP technology, a number of metal wirings for electrical connections may be provided between upper and lower chips. Metal wirings may be formed of a metal material (e.g. Tungsten (W), Copper (Cu), and Aluminum (Al)).

However, if metal wirings are formed of Cu, Cu atoms may diffused into insulating films and may cause leakage current. Cu may also be diffused into individual components (e.g. transistors), resulting in Cu atoms being impurities, because Cu atoms may have a relatively high diffusivity in insulating films and silicon films. Accordingly, in order to form metal wirings of Cu for metal plugs and/or upper wirings in an SIP semiconductor device, it may be necessary to form a diffusion barrier film which prevents diffusion of Cu atoms into insulating films.

Diffusion barrier films may be formed using Physical Vapor Deposition (PVD), which may cause relatively low quality step coverage. Accordingly, using PVD may not be possible in some applications for forming a diffusion barrier film. It may be prohibitive to form a diffusion barrier film (e.g. a titanium nitride (TiN) film) using Metal-Organic Chemical Vapor Deposition (MOCVD), as the materials often used for MOCVD can not be used as diffusion barriers for Cu, as it may diminish reliability of a semiconductor device due to relatively high temperature formation processes.

SUMMARY

Embodiments relate to a System In Package (SIP) semiconductor device and a method for manufacturing a SIP device. In embodiments, a TiSiN film is used as a diffusion barrier film for metal wiring in a SIP semiconductor device. In embodiments, a TiSiN film may provide relatively good step coverage in a relatively easy formation process, which may maximize reliability of a semiconductor device.

In embodiments, a System In Package (SIP) semiconductor device includes metal wiring between at least two semiconductor substrates. In accordance with embodiments, metal wiring may electrically have a specific conducting pattern. In embodiments, a diffusion barrier film formed of TiSiN may surround metal wiring.

Embodiments may relate to a method of manufacturing a System In Package (SIP) semiconductor device. In accordance with embodiments, a SIP device may include at least one of the following: At least one semiconductor substrate including a pattern between the at least two semiconductor substrates, with the pattern being connected to a specific conducting pattern. Depositing a TiN film on and/or over the pattern through thermal decomposition using a Tetrakis-dimethyl-amino-titanium (TDMAT) material. Forming a CVD TiN film through a plasma process on the TiN film in a CVD chamber using H2 plasma gas and N2 plasma gas. Forming a diffusion barrier film including TiSiN by reacting the CVD TiN film with SiH4 gas at an atmospheric temperature between approximately 300° C. and 400° C. Forming a metal film on and/or over the diffusion barrier film.

DRAWINGS

Example FIGS. 1A to 1F illustrate a procedure of forming an SIP semiconductor device, according to embodiments.

Figure 2A:
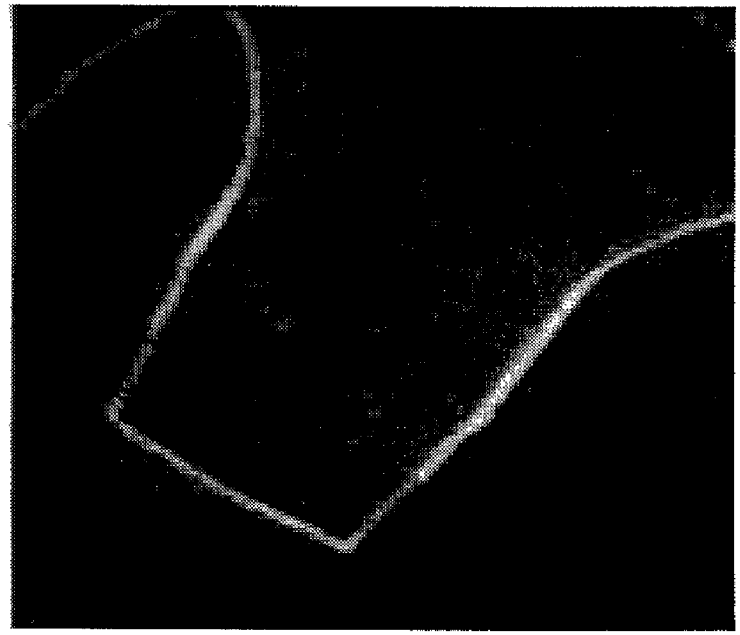

Example FIG. 2A illustrates the step coverage of a Ti layer formed in an SIP semiconductor device, according to embodiments.

Figure 2B:

Example FIG. 2B illustrates the step coverage of an N layer formed in an SIP semiconductor device, according to embodiments.

Example FIG. 3 illustrates a SIP device.

Figure 4:
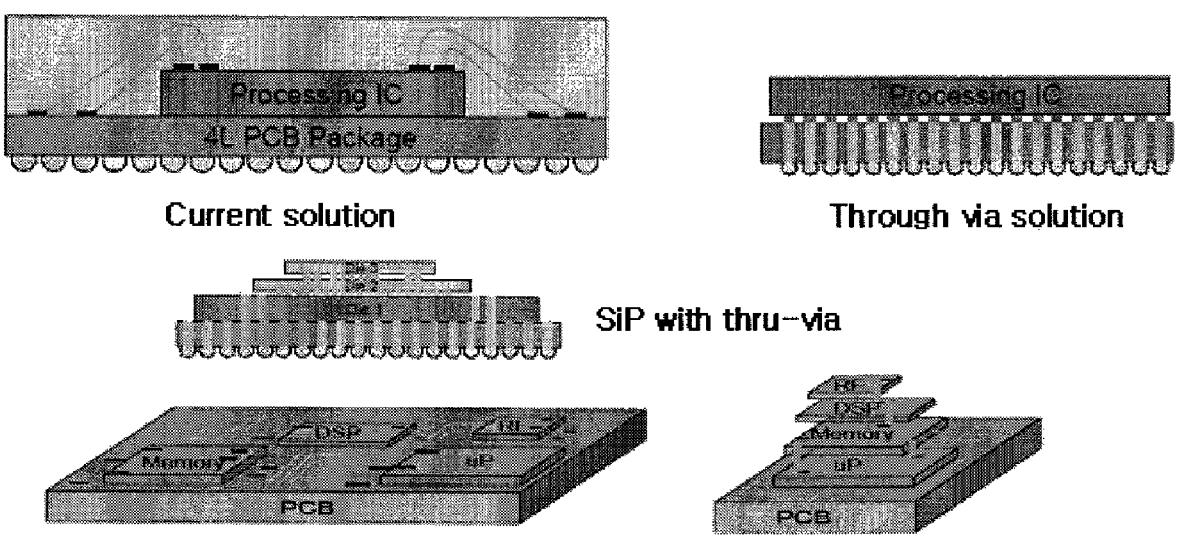

Example FIG. 4 illustrates a comparison of a SIP device and a SOC device.

DESCRIPTION

Example FIGS. 1A to 1F are sectional views illustrating a procedure of forming a System In Package (SIP) semiconductor device, according to embodiments. As illustrated in example FIG. 1A, first insulating film 12 may be formed on and/or over first semiconductor substrate 11, in accordance with embodiments. Lower conducting patterns may be formed in first insulating film 12. Lower conducting patterns 13 may have a predetermined level of conductivity. First insulating film 12 may be a lower insulating film. Lower conducting patterns 13 may be part of at least one of a source/drain region, a gate electrode, a bit line, wiring (e.g. lower wiring), an upper electrode of a capacitor, and/or other similar structure. Lower conducting patterns 13 may be formed using a photolithography process, etching process, and/or a damascene process.

Figure 1A:
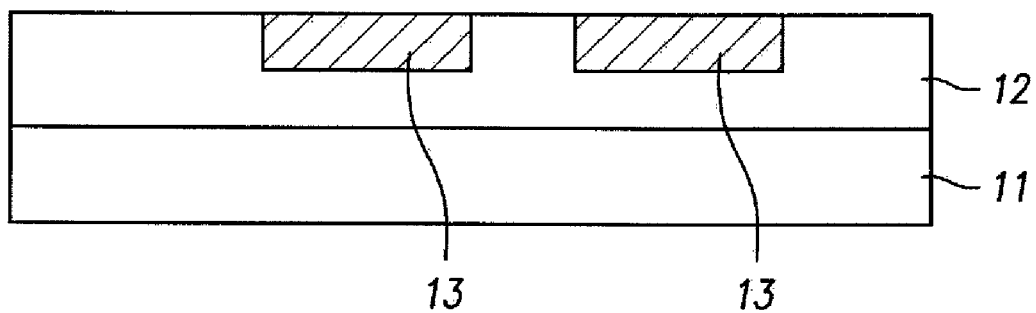
Figure 1B:
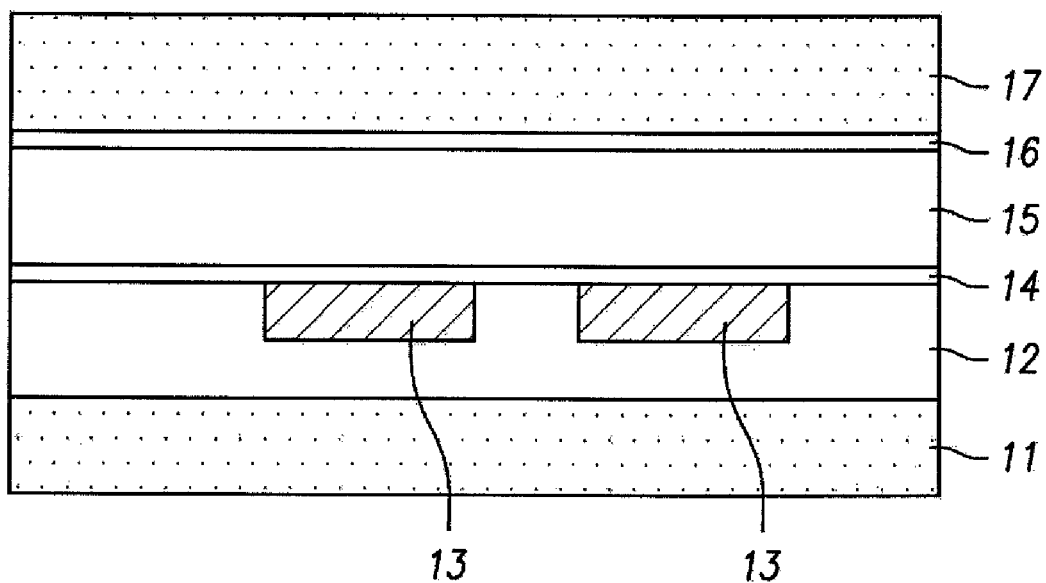

As illustrated in example FIG. 1B, a second semiconductor substrate 17 may be adhered to first insulating film 12, in accordance with embodiments. Second semiconductor substrate may include etch stop film 16 and a second insulating film 15. Second semiconductor substrate may be adhered to first insulating film 12 using an adhesive paste 14. In embodiments, adhesive paste 14 may be an epoxy adhesive or a plastic bonding adhesive.

Etch stop film 16 may be formed of at least one of a silicon nitride (SiN) film, a silicon carbide (SiC) film, and a silicon carbon nitride (SiCN). Etch stop film 16 may prevent over-etching of the second insulating film 15, which may occur when the second semiconductor substrate 17 is etched, in accordance with embodiments. Etch stop film 16 may prevent material of the second semiconductor substrate 17 from infiltrating into second insulating film 15, in accordance with embodiments. Second insulating film 15 may be formed of a low dielectric constant film.

Figure 1C:
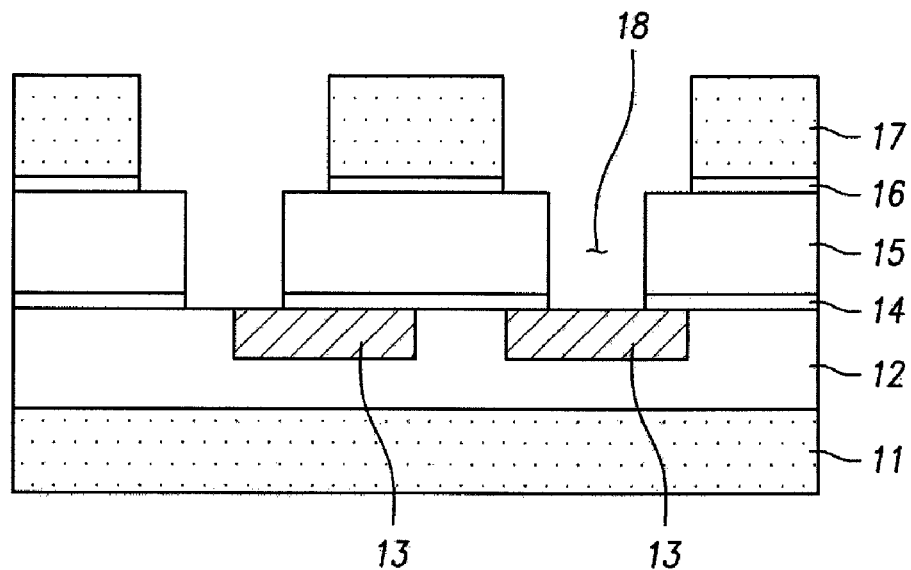

As illustrated in example FIG. 1C, a damascene process may be performed on at least one of second semiconductor substrate 17, etch stop film 16, second insulating film 15, and paste 14 to form patterns 18, in accordance with embodiments. Pattern 18 may have contact holes and/or trenches, in accordance with embodiments. A damascene process may include at least one of a single damascene process and a dual damascene process, in accordance with embodiments.

Figure 1D:
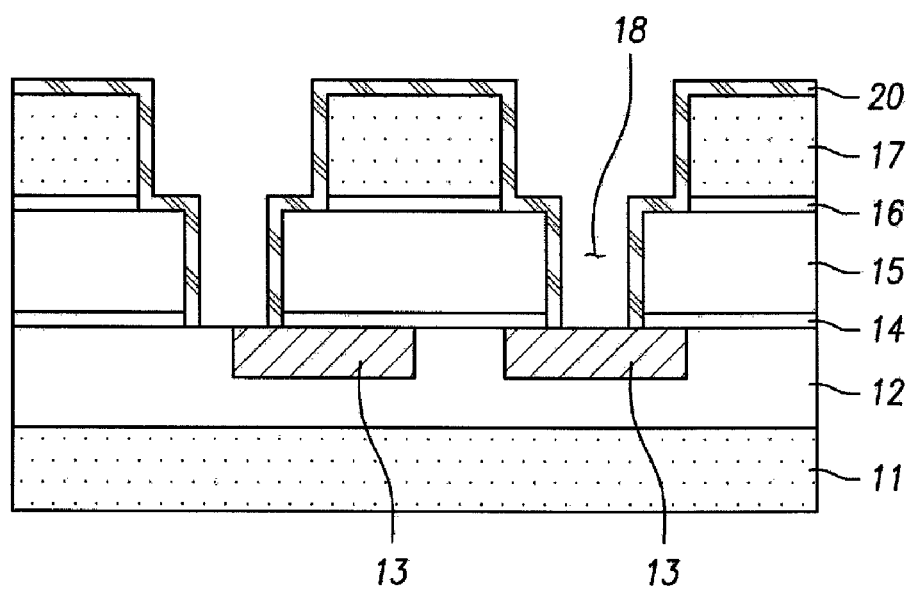

As illustrated in example FIG. 1D, diffusion barrier film 20 may be formed in patterns 18, in accordance with embodiments. Diffusion barrier film 20 may include TiSiN, in accordance with embodiments. Diffusion barrier film 20 may be formed to allow patterns 18 to be filled with a metal material (e.g. at least one of Al, Cu, and W), in accordance with embodiments.

In embodiments, a diffusion barrier film 20 may be formed by depositing a TiN film in patterns 18. A TiN film may have a thickness of approximately 50 Å, in accordance with embodiments. In embodiments, a TiN film may be deposited using a Tetrakis-dimethyl-amino-titanium (TDMAT) material through thermal decomposition. A plasma process may be performed on a deposited thermal TiN film in a chemical vapor deposition (CVD) chamber, in accordance with embodiments. A plasma process may use at least one of H2 plasma gas and N2 plasma gas to form a CVD TiN film, in accordance with embodiments. In embodiments, a plasma process may reduce the thickness of a TiN film. In embodiments, a TiN film may be reduced to have a thickness of approximately 25 Å.

In embodiments, a process of forming a TiN film may be repeated at least one time. From a repeated process, a TiN film may be formed to have a thickness of approximately 50 Å, in accordance with embodiments. In embodiments, a TiN film may be formed to have a thickness of approximately 50 Å without repeating a formation process, by adjusting the thickness of the original TiN film. For example, an initial CVD TiN film may be formed to have a thickness of approximately 30-100 Å.

A TiN film may be reacted with SiH4 gas to form diffusion barrier film 20 made of CVD TiSiN, in accordance with embodiments. In embodiments, a TiN film may be reacted with a SiH4 gas at an atmospheric temperature between approximately 300° C. and approximately 400° C. In embodiments, a TiN film may be reacted with a SiH4 gas at an atmospheric temperature of approximately 350° C.

In accordance with embodiments, a punch-through process may be performed to selectively remove a portion of diffusion barrier film 20 formed on the bottoms of patterns 18 that is on and/or over conducting patterns 13. A punch-through process may use argon plasma, in accordance with embodiments. In embodiments, a punch-through process may not be performed or selectively performed on some of the patterns 18, so that select lower conducting patterns 13 are not exposed.

Figure 1E:
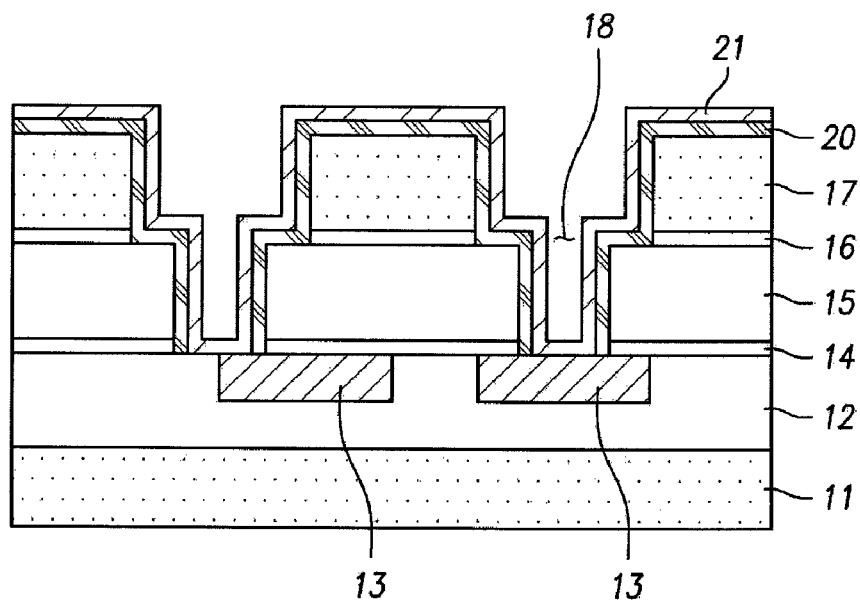

As illustrated in example FIG. 1E, a tantalum (Ta) film 21 may be formed in patterns 18 and/or over diffusion barrier film 20, in accordance with embodiments. In embodiments, Ta film 21 may be formed to have a thickness of approximately 75 Å. In embodiments, Ta film 21 may be formed using metalorganic chemical vapor deposition (MOCVD). Ta film 21 may increase adhesion to metal wiring (e.g. Cu wiring) in patterns 18, which may maximize electromigration (EM) characteristics, in accordance with embodiments. In embodiments, Ta film 21 may increase adhesion to metal wirings that are formed of Al and W, in accordance with embodiments.

Figure 1F:
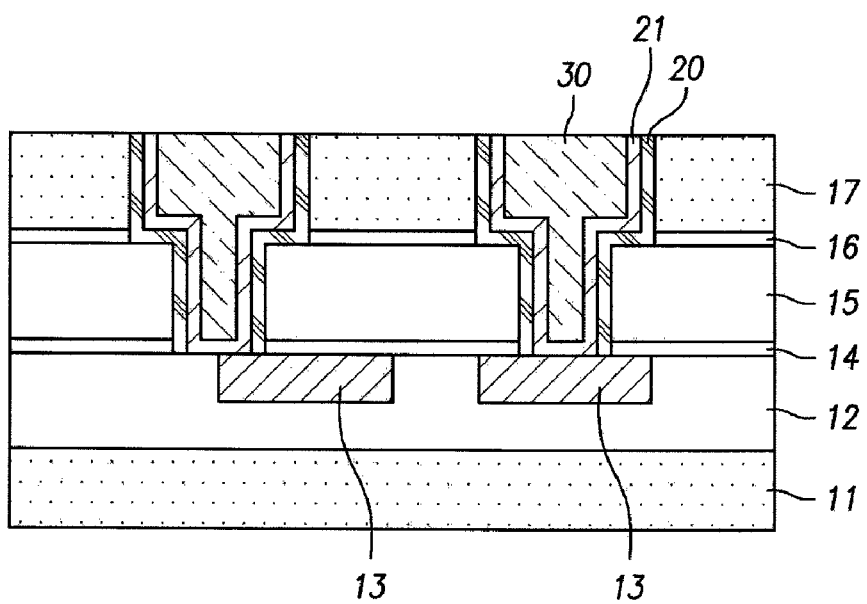

As illustrated in example FIG. 1F, metal film 30 may be formed in pattern 18, in accordance with embodiments. In embodiments, metal film 30 includes Cu. Metal film 30 may be formed on and/or over diffusion barrier film 20 and/or Ta film 21, in accordance with embodiments. Metal film 30 may be formed by forming a Cu seed layer on and/or over diffusion barrier film 20. Electroplating and a heat treatment may be performed on a Cu seed layer. A heat treatment may be performed at a temperature between approximately 200° C. and approximately 400° C. Electroplating and/or a heat treatment may be performed in an N2 and/or H2 gas atmosphere.

In embodiments, metal film 30 may include Tungsten (W). In accordance with embodiments, W may be formed in a contact hole portion of metal film 30. In embodiment metal film 30 may include at least one of Cu and Al. In accordance with embodiments, at least one of Cu and Al may be formed in a trench portion of metal film 30.

After the metal film 30 is formed, at least one of metal film 30, Ta film 21, and diffusion barrier film 20 may be flattened, in accordance with embodiments. In embodiments, flattening may be accomplished using a blank etching technique and/or a Chemical Mechanical Polishing (CMP) technique, until second semiconductor substrate 17 is exposed, as illustrated in example FIG. 1F. In embodiments, metal film 30 may be formed in patterns 18 to form contacts and/or metal wirings (e.g. of CU material). In embodiments, a semiconductor substrate (e.g. including another semiconductor device) may be formed on and/or over metal film 30 to provide a multilayer SIP semiconductor structure.

Table 1 illustrates a comparison of a TiSiN and Ta/TiSiN diffusion barrier film with a Ta/TaN diffusion barrier film, by measuring their Cu diffusion levels according to a Vapor Phase Decomposition (VPD) method. As illustrated Table 1 a TiSiN or Ta/TiSiN diffusion barrier film may maximize and/or optimize Cu diffusion characteristics, in accordance with embodiments.

TABLE 1

| Diffusion Barrier Film | Cu Diffusion Level |
| --- | --- |
| Ta(150 Å)/TaN(150 Å) | 6.78E+12 |
| TiSiN(50 Å) | 8.11E+12 |
| Ta(75 Å)/TiSiN(50 Å) | 4.06E+12 |

In accordance with embodiments, a SIP semiconductor device including a TiSiN diffusion barrier film may prevent and minimize diffusion of metal atoms (e.g. Cu) into other layers, which may mitigate electromigration (EM).

Example FIG. 2A illustrates step coverage of a Ti layer formed on sidewalls and bottoms of patterns 18 using an Electron Energy Loss Spectrometer (EELS) after splitting the TiSiN film, in accordance with embodiments. Example FIG. 2B illustrates measured step coverage of an N layer formed on the sidewalls and bottoms of patterns 18 using an EELS after splitting the TiSiN film, in accordance with embodiments. From these measurements, it can be seen that Ti and N layers of the TiSiN film may be uniformly formed on the sidewalls and bottoms of patterns 18, in accordance with embodiments.

Embodiments relate to a SIP semiconductor device and a method for manufacturing a SIP semiconductor device, wherein contacts and/or metal wirings are formed using a TiSiN diffusion barrier film. In embodiments, a TiSiN diffusion barrier film may be formed uniformly in the SIP semiconductor device, which may prevent electromigration (EM) and maximize the reliability of a SIP semiconductor device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising metal wiring, wherein:
    said metal wiring electrically connects a first semiconductor substrate and a second semiconductor substrate;
    said second semiconductor substrate is over the first semiconductor substrate;
    said metal wiring comprises a diffusion barrier film; and
    said diffusion barrier film comprises titanium silicide nitride; and
    said metal wiring comprises a conductive core formed over the diffusion barrier film.

2. The apparatus of claim 1, wherein the apparatus is a system in package semiconductor device.

3. The apparatus of claim 1, wherein:
    said metal wiring comprises a Ta film; and
    at least a portion of said Ta film is formed between the conductive core and said diffusion barrier film.

4. The apparatus of claim 1, wherein the conductive core comprises at least one of Tungsten, Aluminum, and Copper.

5. The apparatus of claim 1, wherein said metal wiring has a dual damascene formation including trenches and contact holes.

6. The apparatus of claim 5, wherein a portion of the conductive core that is in the contact holes comprises Tungsten.

7. The apparatus of claim 5, wherein a portion of the conductive core that is in the trenches comprises at least one of Copper and Aluminum.

8. The apparatus of claim 1, comprising at least one of:
    a first insulating film formed between the first substrate and the second substrate;
    an adhesive paste formed between the first substrate and the second substrate;
    a second insulating film formed between the first substrate and the second substrate;
    an etch stop layer formed between the first substrate and the second substrate; and
    a conducting pattern formed in the first insulating film.

9. The apparatus of claim 8, wherein said metal wiring is formed in at least one of the adhesive paste, the second insulating film, the etch stop layer, and the second substrate.

10. The apparatus of claim 9, wherein said diffusion barrier film is formed between the conductive core and at least one of the adhesive paste, the second insulating film, the etch stop layer, and the second substrate.

* * * * *